(12) United States Patent
Nakashima et al.

(10) Patent No.: US 10,727,213 B2
(45) Date of Patent: Jul. 28, 2020

(54) POWER SEMICONDUCTOR MODULE AND POWER SEMICONDUCTOR DEVICE

(71) Applicant: Mitsubishi Electric Corporation, Chiyoda-ku (JP)

(72) Inventors: Junichi Nakashima, Chiyoda-ku (JP); Yoshiko Tamada, Chiyoda-ku (JP); Yasushi Nakayama, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/320,500

(22) PCT Filed: Sep. 15, 2017

(86) PCT No.: PCT/JP2017/033475
§ 371 (c)(1),
(2) Date: Jan. 25, 2019

(87) PCT Pub. No.: WO2018/056213
PCT Pub. Date: Mar. 29, 2018

(65) Prior Publication Data
US 2019/0237448 A1   Aug. 1, 2019

(30) Foreign Application Priority Data

Sep. 23, 2016 (JP) .................. 2016-185464

(51) Int. Cl.
*H01L 25/16* (2006.01)
*H02M 7/48* (2007.01)
(Continued)

(52) U.S. Cl.
CPC ............. *H01L 25/16* (2013.01); *H01L 25/07* (2013.01); *H01L 25/18* (2013.01); *H02M 7/003* (2013.01);
(Continued)

(58) Field of Classification Search
CPC ......... H01L 25/16; H01L 25/07; H01L 25/18; H01L 23/3675; H01L 24/32; H01L 24/48;
(Continued)

(56) References Cited

U.S. PATENT DOCUMENTS

2010/0059875 A1\* 3/2010 Sato .................. H01L 23/492
257/690
2014/0284731 A1\* 9/2014 Nakao ............... H01L 23/49579
257/415
(Continued)

FOREIGN PATENT DOCUMENTS

JP    5-15146 A    1/1993
JP    6-311762 A   11/1994
(Continued)

OTHER PUBLICATIONS

International Search Report dated Nov. 28, 2017 in PCT/JP2017/033475 filed on Sep. 15, 2017.

*Primary Examiner* — Shahed Ahmed
(74) *Attorney, Agent, or Firm* — Xsensus LLP

(57) ABSTRACT

Gates of semiconductor switching elements are connected to a gate control wiring pattern. The gate control wiring pattern is further connected to a gate control terminal and a filter terminal which are connected by an element for forming a filter outside a housing. The filter terminal and the gate control terminal are connected to the gate control wiring pattern in such a manner that a section electrically connecting the filter terminal and the gate control terminal overlaps with at least a part of a section electrically connecting the gates of the semiconductor switching elements on the gate control wiring pattern.

16 Claims, 13 Drawing Sheets

(51) Int. Cl.
*H03H 7/01* (2006.01)
*H03H 7/06* (2006.01)
*H03H 11/04* (2006.01)
*H02M 7/00* (2006.01)
*H01L 25/18* (2006.01)
*H01L 25/07* (2006.01)
*H01L 23/00* (2006.01)
*H01L 23/367* (2006.01)

(52) U.S. Cl.
CPC ............ *H02M 7/48* (2013.01); *H03H 7/0138* (2013.01); *H03H 7/06* (2013.01); *H03H 11/04* (2013.01); *H01L 23/3675* (2013.01); *H01L 24/32* (2013.01); *H01L 24/48* (2013.01); *H01L 24/49* (2013.01); *H01L 24/73* (2013.01); *H01L 2224/0603* (2013.01); *H01L 2224/32225* (2013.01); *H01L 2224/48137* (2013.01); *H01L 2224/48139* (2013.01); *H01L 2224/48227* (2013.01); *H01L 2224/49111* (2013.01); *H01L 2224/49175* (2013.01); *H01L 2224/73265* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/19107* (2013.01)

(58) Field of Classification Search
CPC . H01L 24/49; H01L 24/73; H01L 2224/0603; H01L 2224/32225; H01L 2224/48137; H01L 2224/48139; H01L 2224/48227; H01L 2224/49111; H01L 2224/49175; H02M 7/003; H03H 7/06; H03H 11/04
See application file for complete search history.

(56) References Cited

U.S. PATENT DOCUMENTS

2015/0287665 A1* 10/2015 Hanada ................ H01L 25/115
257/691
2016/0172995 A1* 6/2016 Obiraki ................ H05K 7/2039
361/728

FOREIGN PATENT DOCUMENTS

| JP | 2000-209846 A | 7/2000 |
| JP | 2002-141465 A | 5/2002 |
| JP | 2004-96829 A | 3/2004 |
| JP | 2005-129826 A | 5/2005 |

* cited by examiner

POWER SEMICONDUCTOR MODULE AND POWER SEMICONDUCTOR DEVICE

TECHNICAL FIELD

The present invention relates to a power semiconductor module and a power semiconductor device, and particularly to a power semiconductor module including a plurality of semiconductor elements operating in parallel and a power semiconductor device including a plurality of power semiconductor modules operating in parallel.

BACKGROUND ART

Generally, in an insulated type power semiconductor module used in a power conversion device such as an inverter or a converter, a wiring pattern is formed on an insulating layer provided on a metal plate which serves as a heat radiation plate, and power semiconductor elements such as transistors and diodes are provided on the wiring pattern. Then the power semiconductor elements are connected to an external terminal or the like by wire bonding and sealed with resin, for example.

In order to obtain a power semiconductor module which performs switching operation at a large current, the module is provided with a plurality of semiconductor elements operating in parallel. However, even when the plurality of semiconductor elements operating in parallel have equivalent characteristics to each other, due to different wiring in the module, the switching characteristics may become different when the plurality of semiconductor elements are made to operate in parallel. As the number of semiconductor elements operating in parallel increases, the footprint of each element increases and the wiring becomes complicated, which increases the parasitic inductance between the plurality of semiconductor elements operating in parallel.

Due to the variation on operation of the plurality of semiconductor elements operating in parallel and the increase of the parasitic inductance between the elements, an oscillation may occur. The oscillation is called as "gate oscillation" which is caused by the parasitic capacitance of the semiconductor elements and the parasitic inductance between the elements. The gate oscillation may cause the semiconductor elements to degrade or breakdown, and may also cause noises to be radiated to the outside of the module or cause conductive noises in the external circuit, for example.

It is known that the gate oscillation may be suppressed by connecting a resistor in series to a gate wiring of a semiconductor element as described in PTL 1 (see PTL 1). PTL 2 discloses that the gate oscillation may be suppressed by connecting a resistor in parallel to an emitter wiring of the plurality of semiconductor elements connected in parallel (see PTL 2).

On the other hand, as a measure for reducing the variation on switching characteristics that causes the gate oscillation, PTL 3 discloses a technique of adjusting the inductance and resistance of the emitter wiring of a plurality of semiconductor elements connected in parallel so as to suppress the current imbalance between the elements (see PTL 3). Further, PTLs 4 to 6 disclose a technique of reducing the current imbalance, noise or oscillation between elements by coupling a gate wiring and an emitter wiring to a magnet in such a manner that the gate wiring and the emitter wiring are configured to pass through a ferrite core of the magnet (see PTLs 4 to 6).

CITATION LIST

Patent Literature

[PTL 1] Japanese Patent Laying-Open No. 2005-129826
[PTL 2] Japanese Patent Laying-Open No. 2002-141465
[PTL 3] Japanese Patent Laying-Open No. 2000-209846
[PTL 4] Japanese Patent Laying-Open No. 2004-96829
[PTL 5] Japanese Patent Laying-Open No. 5-15146
[PTL 6] Japanese Patent Laying-Open No. 6-311762

SUMMARY OF INVENTION

Technical Problem

Generally, a power semiconductor module is sealed with a sealing agent such as resin. When the module is sealed in a sealing agent, it is impossible to adjust (or exchange) the resistor or the like disposed inside the module (PTLs 1 to 3) so as to suppress the gate oscillation or reduce the current imbalance between the elements. In addition, the resistor connected to the gate for suppressing the gate oscillation may lower the switching speed (PTL 1).

As described in PTLs 4 to 6, the oscillation may be suppressed by connecting a filter such as a common mode reactor or a ferrite core to the wiring of the module. However, it is difficult to dispose a filter such as that described above inside the module, and the performance of the filter may be deteriorated at high temperature. Moreover, the techniques described in PTLs 4 to 6 may have the same problems as the techniques described in PTLs 1 to 3.

Furthermore, since the power semiconductor module as a product will be connected to an external wiring by the user, and depending on how the external wiring is routed, the module may be subjected to the electromagnetic induction from the external wiring, which may change its electric characteristics. In this case, even though a measure is taken to suppress the gate oscillation for the module as a unit, the gate oscillation may still occur inside the module. Thereby, it is desired to flexibly cope with the gate oscillation resulted from the outside of the module.

The present invention has been made to solve the aforementioned problems, and an object thereof is to provide a power semiconductor module including a plurality of semiconductor elements operating in parallel, the power semiconductor module being provided with a circuit which is provided and adjusted outside the module so as to suppress the gate oscillation.

Another object of the present invention is to provide a power semiconductor device including a plurality of power semiconductor modules operating in parallel, each power semiconductor module including a plurality of semiconductor elements operating in parallel, the power semiconductor device being provided with a circuit which is provided and adjusted outside the module so as to suppress the gate oscillation.

Solution to Problem

The power semiconductor module according to the present invention comprises a first plurality of semiconductor elements operating in parallel, a housing configured to house the first plurality of semiconductor elements, and a first external terminal and a second external terminal. The first and second external terminals are connected to a wiring which is connected by respective terminals of the first plurality of semiconductor elements, and are configured to electrically connect a first filter forming element outside the housing to the wiring. The first external terminal and the second external terminal are electrically connected to the wiring in such a manner that a section electrically connecting the first external terminal and the second external terminal on the wiring includes at least a part of a current-carrying region on the wiring when the first plurality of semiconductor elements are operating in parallel.

The power semiconductor device according to the present invention comprises a first power semiconductor module and a second power semiconductor module operating in parallel, and a filter forming element. Each of the first power semiconductor module and the second power semiconductor module includes a plurality of semiconductor elements operating in parallel, a housing configured to house the plurality of semiconductor elements, and a first external terminal and a second external terminal connected to a wiring which is connected by respective terminals of the plurality of semiconductor elements. The first external terminal and the second external terminal are electrically connected to the wiring in such a manner that a section electrically connecting the first external terminal and the second external terminal on the wiring includes at least a part of a current-carrying region on the wiring when the plurality of semiconductor elements are operating in parallel. A filter forming element provided outside the housing is electrically connected between the first external terminal of the first power semiconductor module and the first external terminal of the second power semiconductor module.

Advantageous Effects of Invention

According to the power semiconductor module of the present invention, the first external terminal and the second external terminal are electrically connected to the wiring in such a manner that a section electrically connecting the first external terminal and the second external terminal on the wiring which is connected by the respective terminals of the plurality of semiconductor elements operating in parallel includes at least a part of a current-carrying region on the wiring when the first plurality of semiconductor elements are operating in parallel. Thus, a filter may be formed by connecting a filter forming element between the first external terminal and the second external terminal outside the housing so as to reduce the gate oscillation.

Therefore, according to the power semiconductor module, a filter may be provided and adjusted outside the module so as to suppress the gate oscillation. Further, according to the power semiconductor module, if the filter is provided as described above, the gate resistance may be minimized or dispensed with, which makes it possible to prevent the switching speed from being lowered by the gate resistance. Further effects may be obtained in combination with the gate resistance.

According to the power semiconductor device of the present invention, the first external terminal and the second external terminal of each of the power semiconductor modules are electrically connected to the wiring in such a manner that a section electrically connecting the first external terminal and the second external terminal on the wiring which is connected by the respective terminals of the plurality of semiconductor elements operating in parallel includes at least a part of a current-carrying region on the wiring when the plurality of semiconductor elements are operating in parallel, and a filter forming element outside the housing is electrically connected between the first external terminal of the first power semiconductor module and the first external terminal of the second power semiconductor module. Thereby, it is possible to form a filter so as to suppress oscillation occurring between the modules and reduce gate oscillation inside each module.

Therefore, according to the power semiconductor device, a filter may be provided and adjusted outside the module so as to suppress the gate oscillation between the modules and reduce the gate oscillation inside each module. Further, according to the power semiconductor device, if the filter is provided as described above, the gate resistance may be minimized or dispensed with, which makes it possible to prevent the switching speed from being lowered by the gate resistance.

DESCRIPTION OF EMBODIMENTS

Figure 1:
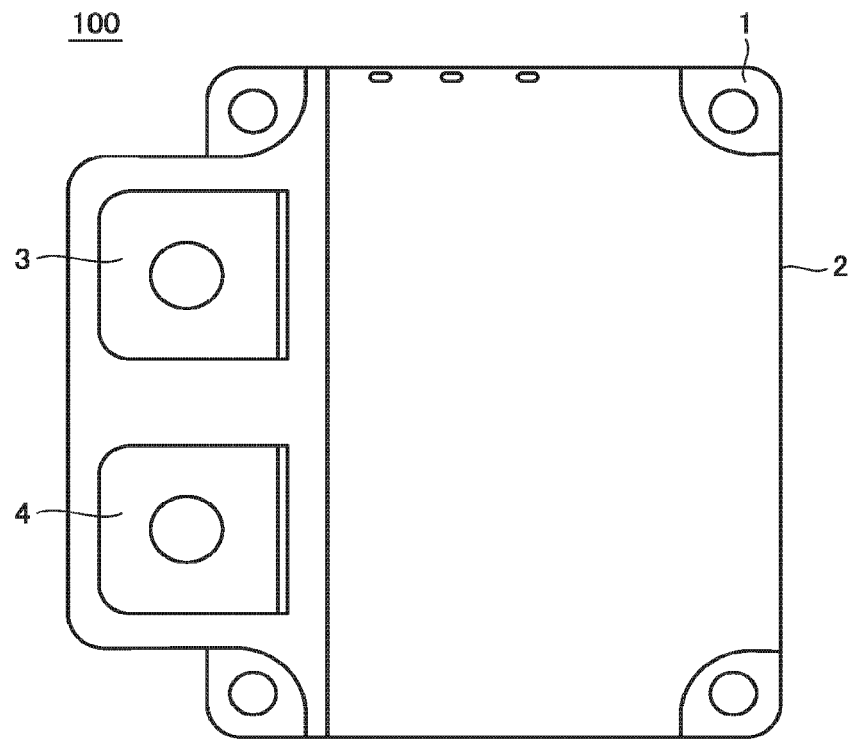
FIG. 1 is a top view illustrating a power semiconductor module according to a first embodiment.

Hereinafter, embodiments of the present invention will be described in detail with reference to the drawings. In the following description, a plurality of embodiments will be described; however, it is initially expected at the time of filing the present application that the configurations described in each embodiment may be appropriately combined as long as they are not contradictory to each other. It should be noted that the same or corresponding portions in the drawings are denoted by the same reference numerals, and the description thereof will not be repeated.

First Embodiment

Figure 2:
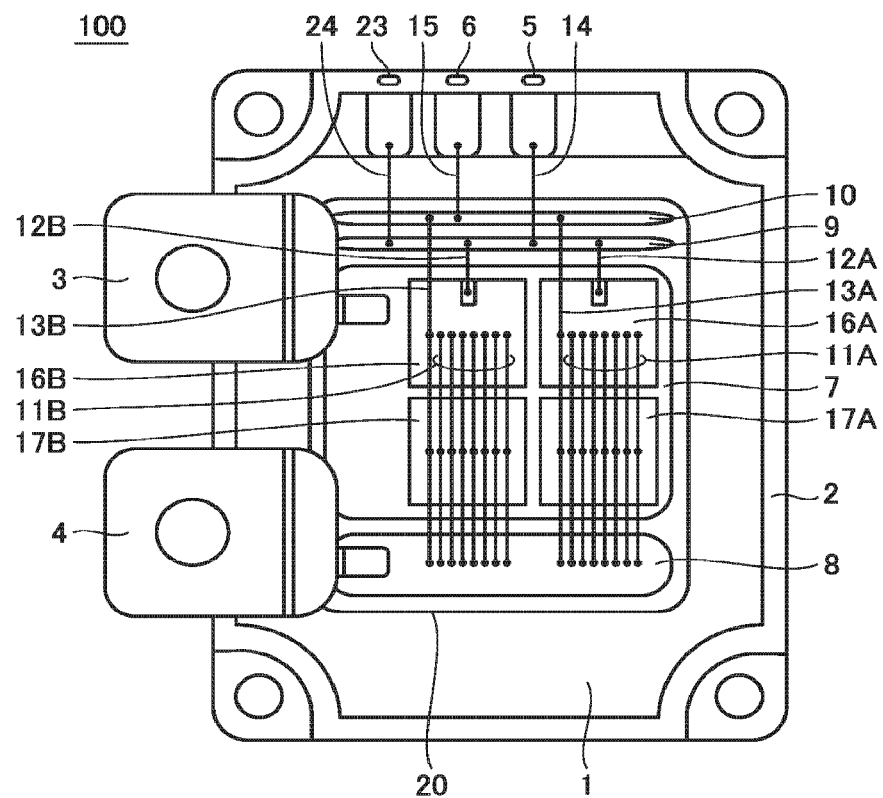
FIG. 2 is a plan view schematically illustrating the inner configuration of the power semiconductor module illustrated in FIG. 1.
Figure 3:
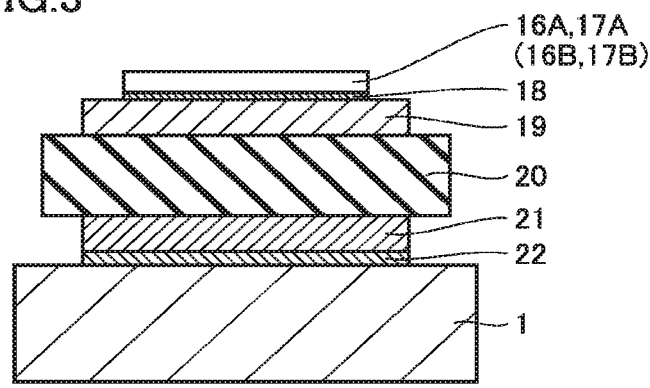
FIG. 3 is a cross-sectional view schematically illustrating a part of a cross section of the power semiconductor module illustrated in FIG. 1.
Figure 4:
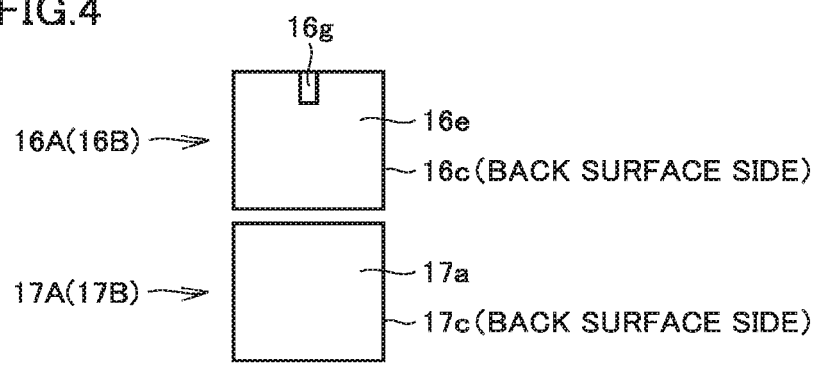
FIG. 4 is a plan view schematically illustrating the configuration of a semiconductor element illustrated in FIG. 1.

The configuration of a power semiconductor module according to a first embodiment of the present invention will be described with reference to FIGS. 1 to 4. FIG. 1 is a top view illustrating a power semiconductor module according to the first embodiment, and FIG. 2 is a plan view schematically illustrating the inner configuration of the power semiconductor module illustrated in FIG. 1. FIG. 3 is a cross-sectional view schematically illustrating a part of a cross section of the power semiconductor module illustrated in FIG. 1, and FIG. 4 is a plan view schematically illustrating the configuration of the semiconductor element illustrated in FIG. 1.

With reference to FIGS. 1 to 4, the power semiconductor module 100 may be appropriately used in a power conversion device such as an inverter or a converter. The power semiconductor module 100 includes a base plate 1, a housing 2, a positive electrode 3, and a negative electrode 4. The base plate 1 is a heat dissipation plate which is made of metal and configured to dissipate the heat inside the module to the outside thereof. The positive electrode 3 and the negative electrode 4 are exposed to the outside of the housing 2, and are connected to a positive electrode bus bar and a negative electrode bus bar (not shown), respectively.

The power semiconductor module 100 further includes an insulating substrate 20, a collector wiring pattern 7, an emitter wiring pattern 8, a gate control wiring pattern 9, an emitter control wiring pattern 10, semiconductor switching elements 16A and 16B, and freewheel diodes 17A and 17B.

The insulating substrate 20 is typically made of ceramics, but it may be a metal substrate provided with a resin insulating layer. As illustrated in FIG. 3, a wiring pattern 19 (including the collector wiring pattern 7, the emitter wiring pattern 8, the gate control wiring pattern 9 and the emitter wiring pattern 10) may be joined to the front surface (the upper surface in the drawing) of the insulating substrate 20 by brazing or the like, and a back surface pattern 21 may be joined to the back surface (the lower surface in the drawing) of the insulating substrate 20 by brazing or the like. The back surface pattern 21 brazed to the insulating substrate 20 is joined to the base plate 1 via a solder 22, and the semiconductor switching elements 16A, 16B and the freewheel diodes 17A, 17B are joined to each other on the wiring pattern 19 via a solder 18. Other bonding materials may be used instead of the solders 18 and 22.

Each of the semiconductor switching elements 16A and 16B is a self-arc-extinguishing type semiconductor switching element and typically a power MOSFET (Metal Oxide Semiconductor Field Effect Transistor), it may be a bipolar transistor such as an IGBT (Insulated Gate Bipolar Transistor) as well. The freewheel diodes 17A and 17B are connected in anti-parallel to the semiconductor switching elements 16A and 16B, respectively.

In order to operate at a large current, the semiconductor module 100 includes a plurality of semiconductor switching elements 16A and 16B operating in parallel and freewheel diodes 17A and 17B corresponding thereto. Although in each of the following embodiments including the first embodiment, the number of semiconductor switching elements and freewheel diodes disposed in parallel is 2, it may be 3 or more.

Each of the semiconductor switching elements 16A and 16B and the freewheel diodes 17A and 17B is made of a wide band gap semiconductor. The wide band gap semiconductor may be, for example, any one of silicon carbide (SiC), gallium nitride (GaN), gallium oxide ($Ga_2O_3$), and diamond (C).

Since the wide band gap semiconductor is superior in voltage resistance compared with the conventional silicon semiconductor, if each of semiconductor switching elements 16A, 16B and the freewheel diodes 17A, 17B is made of a wide band gap semiconductor, it is possible for each element to resist the same voltage with a half thickness or less compared with the conventional silicon semiconductor. As a result, it is possible to reduce the size of a chip constituting each of the semiconductor switching elements 16A, 16B and the freewheel diodes 17A, 17B. Furthermore, since the thickness is made smaller as compared with the conventional silicon semiconductor device, the resistance is reduced accordingly, which makes it possible to reduce the loss.

Each of the semiconductor switching elements 16A and 16B is soldered to the collector wiring pattern 7 on a collector pad 16c (FIG. 4), and each of the freewheel diodes 17A and 17B is soldered to the collector wiring pattern 7 on a cathode pad 17c. One end of an emitter wire 11A is connected to an emitter pad 16e (FIG. 4) of the semiconductor switching element 16A, the emitter wire 11A is further stitched to an anode pad 17a (FIG. 4) of the freewheel diode 17A, and the other end of the emitter wire 11A is connected to the emitter wiring pattern 8. Similarly, one end of an emitter wire 11B is connected to the emitter pad 16e of the semiconductor switching element 16B, the emitter wire 11B is further stitched to the anode pad 17a of the freewheel diode 17B, and the other end of the emitter wire 11B is connected to the emitter wiring pattern 8.

A gate pad 16g (FIG. 4) of the semiconductor switching element 16A is connected to the gate control wiring pattern 9 via a gate control wire 12A. Similarly, the gate pad 16g of the semiconductor switching element 16B is connected to the gate control wiring pattern 9 via a gate control wire 12B.

With such a configuration, the semiconductor switching element 16A and the freewheel diode 17A are electrically connected in parallel with the semiconductor switching element 16B and the freewheel diode 17B, and thereby, the semiconductor switching element 16A and the freewheel diode 17A operate in parallel to the semiconductor switching element 16B and the freewheel diode 17B.

The emitter control wiring pattern 10 is connected to the emitter wiring pattern 8 via emitter control wires 13A and 13B. The emitter control wire 13A is stitched to the emitter pad 16e of the semiconductor switching element 16A and the anode pad 17a of the freewheel diode 17A, and the emitter control wire 13B is stitched to the emitter pad 16e of the semiconductor switching element 16B and the anode pad 17a of the freewheel diode 17B.

The gate control wiring pattern 9 and the emitter control wiring pattern 10 are electrically connected to a drive circuit (driver) outside the housing 2. Thus, external terminals 5 and 6 are formed from metal on the housing 2 through insert-molding or outsert-molding, and the gate control wiring pattern 9 and the emitter control wiring pattern 10 are connected to the external terminals 5 and 6 via wires 14 and 15 (hereinafter, the external terminal 5 is also referred to as "gate control terminal 5" and the external terminal 6 is also referred to as "emitter control terminal 6").

The power semiconductor module 100 includes semiconductor switching elements 16A and 16B operating in parallel and freewheel diodes 17A and 17B corresponding thereto. Thus, due to the reasons such as variations on the wiring constant between the elements operating in parallel, fast switching operation and the like, unintentional oscillation (gate oscillation) may occur in the gate voltage of the semiconductor switching elements 16A and 16B.

For example, in double-pulse switching by using L load (inductance), a gate oscillation with a large amplitude may occur in the voltage between the gate and the emitter of the semiconductor switching elements 16A and 16B when they are turned on or turned off. It is considered that the gate oscillation may be caused by the parasitic capacitance of the semiconductor switching elements 16A and 16B and the parasitic inductance of the wiring connected to the semiconductor switching elements 16A and 16B. The gate oscillation may damage the oxide film of the semiconductor switching elements 16A and 16B, resulting in element deterioration, radiation noise and propagation noise or the like which may cause further gate oscillation. In addition, the gate oscillation may affect other elements inside the module which are connected in parallel through a wiring.

Therefore, in the present invention, the gate oscillation is suppressed based on the fact that when a gate oscillation occurs in a signal to the semiconductor switching elements 16A and 16B, the parasitic inductance of the wiring connected to the semiconductor switching elements 16A and 16B may serve as an oscillation path. Specifically, in the power semiconductor module 100 according to the first embodiment, a filter is formed relative to the gate control wiring pattern 9 connected by the gates of the semiconductor switching elements 16A and 16B so as to suppress the gate oscillation.

However, it is difficult to dispose such a filter inside the power semiconductor module 100, and the performance of the filter may be deteriorated at high temperature. In the power semiconductor module 100, in addition to the gate control terminal 5, a filter terminal 23 is further provided in connection with the gate control wiring pattern 9, and a capacitor for constituting a filter is connected between the gate control terminal 5 and the filter terminal 23 outside the housing 2.

Similar to the gate control terminal 5 and the emitter control terminal 6, the filter terminal 23 is also formed on the housing 2 through insert-molding or outsert-molding, and is connected to the gate control wiring pattern 9 via a wire 24. A filter is formed relative to the gate control wiring pattern 9 by connecting a capacitor between the gate control terminal 5 and the filter terminal 23 outside the housing 2. Thus, even if the housing is sealed with resin or the like, it is possible to adjust the capacitance of the capacitor outside the housing so as to make the filter have desired characteristics.

Figure 5:
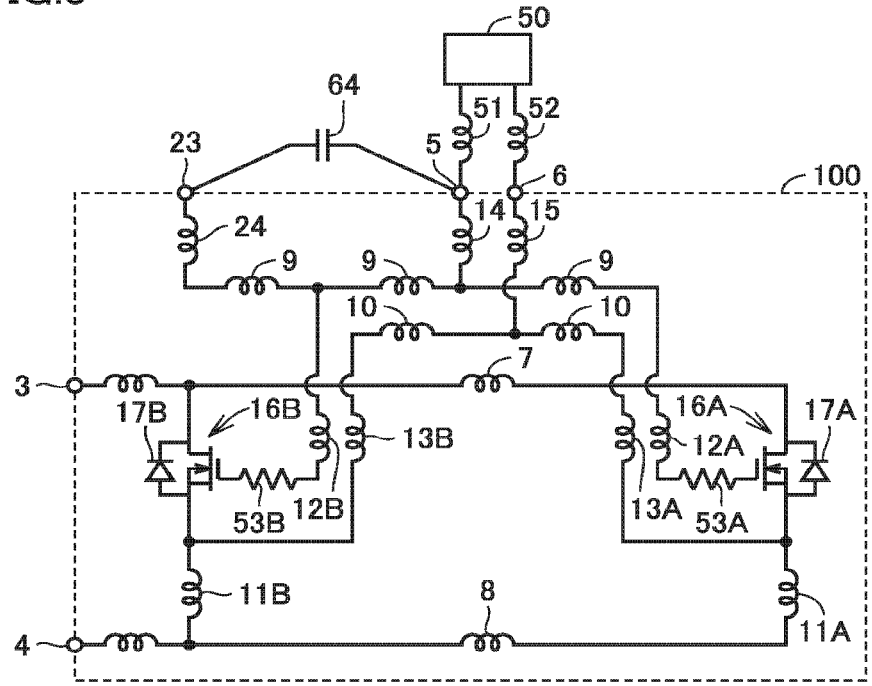
FIG. 5 is an equivalent circuit diagram illustrating the electrical configuration of the power semiconductor module according to the first embodiment.

FIG. 5 is an equivalent circuit diagram illustrating the electrical configuration of the power semiconductor module 100. With reference to FIG. 5, the gate of the semiconductor switching element 16A is connected to the gate control wiring pattern 9 via a gate resistor 53A built in the element or mounted in the module and a gate control wire 12A, and then connected to the terminal 5 via a wire 14. Similarly, the gate of the semiconductor switching element 16B is connected to the gate control wiring pattern 9 via a gate resistor 53B and a gate control wire 12B built in the element or mounted in the module, and then connected to the gate control terminal 5 via the same wire 14. The gate control terminal 5 is connected to a driver 50 via a driver gate control wiring 51.

As described above, in the power semiconductor module 100 according to the first embodiment, the gate control wiring pattern 9 is connected to the filter terminal 23 via the wire 24, and the capacitor 64 is connected between the gate control terminal 5 and the filter terminal 23 outside the power semiconductor module 100. Thereby, an LC parallel resonance circuit is formed by the capacitance of the capacitor 64 and the inductance of the gate control wiring pattern 9, which makes it possible to suppress the gate oscillation occurring in the gate control wiring pattern 9.

In the present embodiment, the filter terminal 23 is connected to the gate control wiring pattern 9 in such a manner that a section electrically connected to the gate control terminal 5 and the filter terminal 23 on the gate control wiring pattern 9 overlaps with at least a part of a section electrically connected to the gates of the semiconductor switching elements 16A and 16B on the gate control wiring pattern 9.

Figure 6:
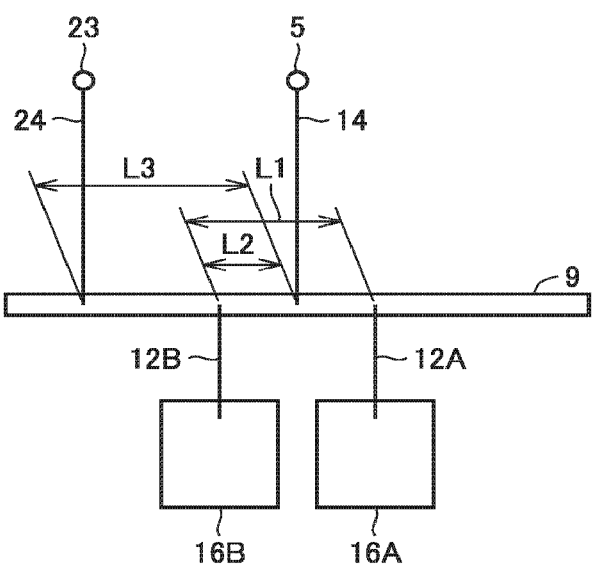
FIG. 6 is a view for explaining how a filter terminal is connected to a gate control wiring pattern.

FIG. 6 is a view for explaining how the filter terminals 23 is connected to the gate control wiring pattern 9. With reference to FIG. 6, the filter terminals 23 is connected to the gate control wiring pattern 9 in such a manner that a section L3 between the gate control terminal 5 and the filter terminal 23 overlaps with at least a part (section L2) of a connection section L1 between the semiconductor switching elements 16A and 16B on the filter control wiring pattern 9. In the example illustrated in FIG. 6, the gate control terminal 5 is connected to a substantially central point of the connection section L1 between the semiconductor switching elements 16A and 16B, and the filter terminal 23 is connected to a point away from the gate control terminal 5 by L3 (L3>L2).

Thereby, when the capacitor 64 (FIG. 5) is connected between the filter terminal 23 and the gate control terminal 5, it is possible to form a filter (LC Parallel resonance circuit) so as to suppress the gate oscillation occurring between the semiconductor switching elements 16A and 16B.

Figure 7:
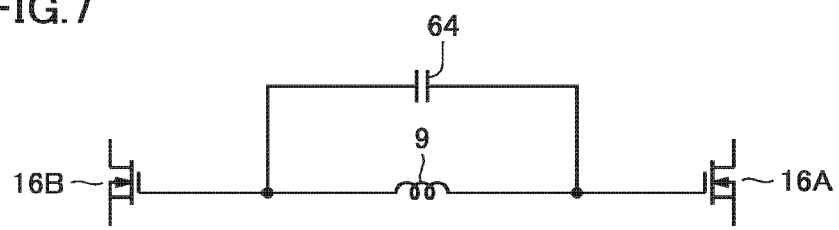
FIG. 7 is a diagram schematically illustrating a circuit configuration of a filter formed relative to a gate control wiring pattern.

FIG. 7 is a diagram schematically illustrating a circuit configuration of the filter formed relative to the gate control wiring pattern 9. With reference to FIG. 7, an LC parallel resonance circuit is formed by the inductance of (at least a part of) the gate control wiring pattern 9 and the capacitor 64 connected between the gate control terminal 5 and the filter terminal 23. As described above, since the capacitor 64 is provided outside the housing 2, the capacitor 64 may be appropriately adjusted outside the housing so as to make the LC parallel resonance circuit have a high impedance at the oscillation frequency of the gate oscillation.

Figure 8:
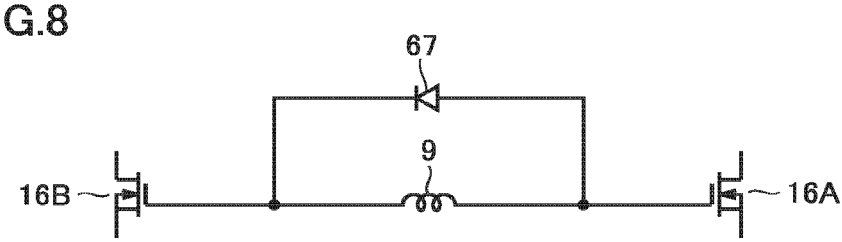
FIG. 8 is a diagram illustrating a modification of the filter illustrated in FIG. 7.
Figure 9:
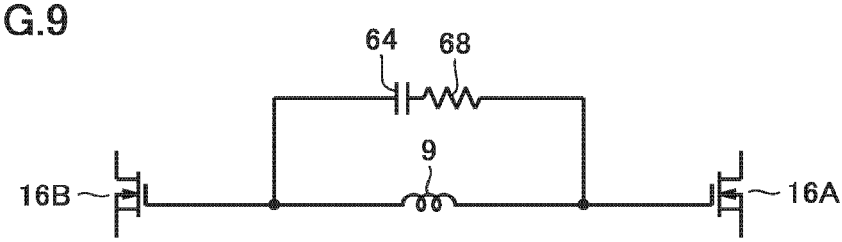
FIG. 9 is a diagram illustrating another modification of the filter illustrated in FIG. 7.

In this circuit configuration, the same effect may be obtained by replacing the capacitor 64 illustrated in FIG. 7 with a rectifying type semiconductor element 67 illustrated in FIG. 8. As illustrated in FIG. 9, a resistor 68 may be connected in series to the capacitor 64 to form an LCR series-parallel circuit, and the capacitor 64 and the resistor 68 may be appropriately adjusted so as to make the LCR series-parallel circuit have a high impedance at the oscillation frequency of the gate oscillation.

Although not specifically shown in the drawings, if the gate control terminal 5 and the filter terminal 23 are connected to the gate control wiring pattern 9 in such a manner that the section L3 between the gate control terminal 5 and the filter terminal 23 does not overlap with the connection section L1 between the semiconductor switching elements 16A and 16B, it is impossible to form a filter to suppress the gate oscillation occurring between the semiconductor switching elements 16A and 16B.

With reference to FIG. 5 again, the collectors of the semiconductor switching elements 16A and 16B are connected to the collector wiring pattern 7, and then connected to the positive electrode 3. The emitters of the semiconductor switching elements 16A and 16B are connected to the emitter wiring pattern 8 via the emitter wires 11A and 11B, respectively, and then connected to the negative electrode 4.

Meanwhile, the emitters of the semiconductor switching elements 16A and 16B are connected to the emitter control wiring pattern 10 via the emitter control wires 13A and 13B, respectively, and then connected to the emitter control terminal 6 via the wire 15. The emitter control terminal 6 is connected to the driver 50 via a driver-emitter control wiring 52.

In the above, it is described that the capacitor 64 is connected between the gate control terminal 5 and the filter terminal 23 outside the housing of the power semiconductor module 100. However, it is acceptable that a resistor is further connected between the gate control terminal 5 and the filter terminal 23.

Figure 10:
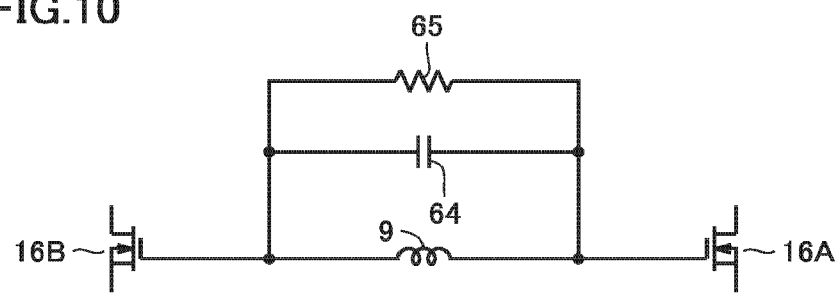
FIG. 10 is a diagram schematically illustrating another circuit configuration of a filter formed relative to a gate control wiring pattern.

FIG. 10 is a diagram schematically illustrating another circuit configuration of a filter formed relative to the gate control wiring pattern 9. With reference to FIG. 10, the capacitor 64 and a resistor 65 are connected between the gate control terminal 5 and the filter terminal 23 outside the housing of the power semiconductor module 100.

Thus, an LCR parallel resonance circuit is formed by the inductance of (at least a part of) the gate control wiring pattern 9, the capacitor 64 and the resistor 65 connected between the gate control terminal 5 and the filter terminal 23. As described above, since the capacitor 64 and the resistor 65 are connected outside the housing 2, it is easy to form the LCR parallel resonance circuit as a filter to suppress the gate oscillation, and the gate oscillation may be suppressed by adjusting the strength of the filter.

Figure 11:
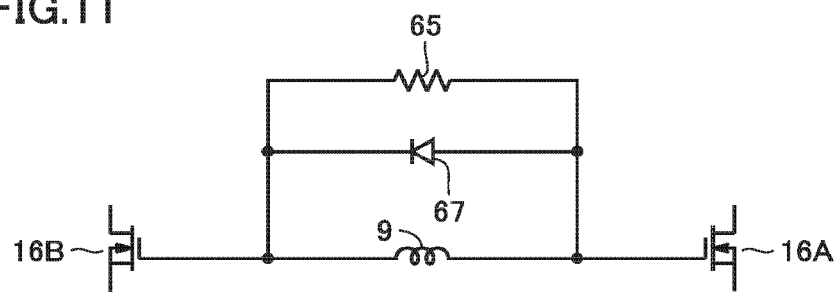
FIG. 11 is a diagram illustrating a modification of the filter illustrated in FIG. 10.

In this circuit configuration, the same effect may be obtained by replacing the capacitor 64 illustrated in FIG. 10 with a rectifying type semiconductor element 67 illustrated in FIG. 11.

In addition, a semiconductor switching element may be disposed between the gate control terminal 5 and the filter terminal 23 to make the filter active.

Figure 12:
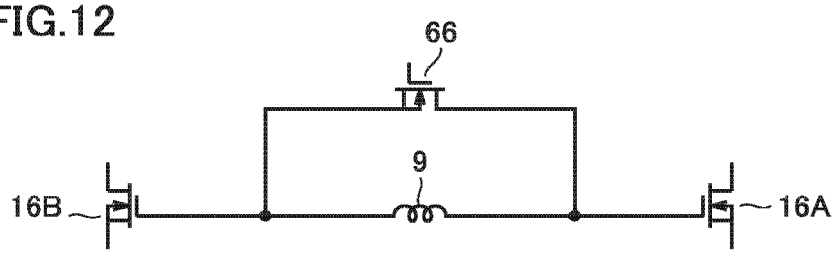
FIG. 12 is a diagram schematically illustrating still another circuit configuration of a filter formed relative to a gate control wiring pattern.

FIG. 12 is a diagram schematically illustrating still another circuit configuration of a filter formed relative to the gate control wiring pattern 9. With reference to FIG. 12, a self-arc-extinguishing type semiconductor switching element 66 is connected between the gate control terminal 5 and the filter terminal 23 outside the housing of the power semiconductor module 100.

A filter is formed by the semiconductor switching element 66 and the inductance of (at least a part of) the gate control wiring pattern 9. Since the semiconductor switching element 66 is provided outside the housing 2, the switching frequency of the semiconductor switching element 66 may be adjusted outside the housing so as to easily adjust the strength of the filter or the frequency band of the filter.

Figure 13:
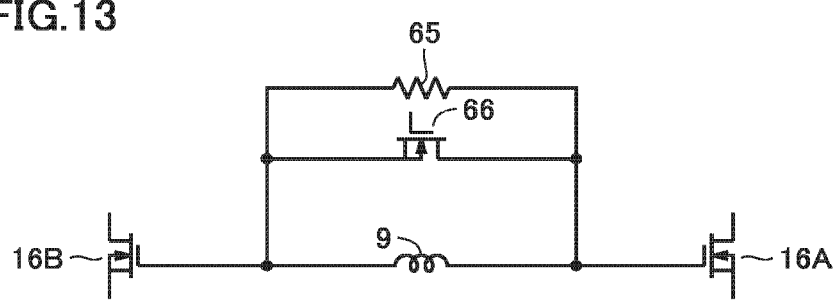
FIG. 13 is a diagram illustrating a modification of the filter illustrated in FIG. 12.
Figure 14:
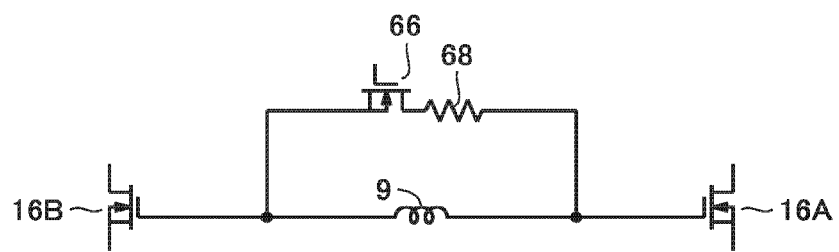
FIG. 14 is a diagram illustrating another modification of the filter illustrated in FIG. 12.

It is acceptable to connect a resistor 65 in parallel to the semiconductor switching element 66 as illustrated in FIG. 13 or a resistor 68 in series to the semiconductor switching element 66 as illustrated in FIG. 14. Although not specifically shown in the drawings, a capacitor may be connected in parallel to the semiconductor switching element 66 to form a filter, and the filter may be adjusted appropriately by adjusting the capacitor.

As described above in the first embodiment, the filter terminal 23 and the gate control terminal 5 are connected to the gate control wiring pattern 9 in such a manner that a section electrically connected to the filter terminal 23 and the gate control terminal 5 overlaps with at least a part of a connection section between the semiconductor switching elements 16A and 16B on the gate control wiring pattern 9. Thus, a filter may be formed by connecting the capacitor 64 between the filter terminal 23 and the gate control terminal 5 outside the housing 2 so as to reduce the gate oscillation.

Therefore, according to the first embodiment, a filter may be provided and adjusted outside the module so as to reduce the gate oscillation. According to the first embodiment, if the filter is provided as described above, the gate resistance of the semiconductor switching elements 16A and 16B may be minimized or dispensed with, which makes it possible to prevent the switching speed of the semiconductor switching elements 16A and 16B from being lowered by the gate resistance.

Modification of the First Embodiment

In the first embodiment above, it is described that the filter terminal 23 is provided in connect with the gate control wiring pattern 9, and an element (such as a capacitor 64 or the like) for forming the filter is connected between the filter terminal 23 and an existing gate control terminal 5 which is connected to the gate control wiring pattern 9, it is acceptable that the existing gate control terminal 5 may not be used, and a plurality of filter terminals may be provided and used instead.

Figure 15:
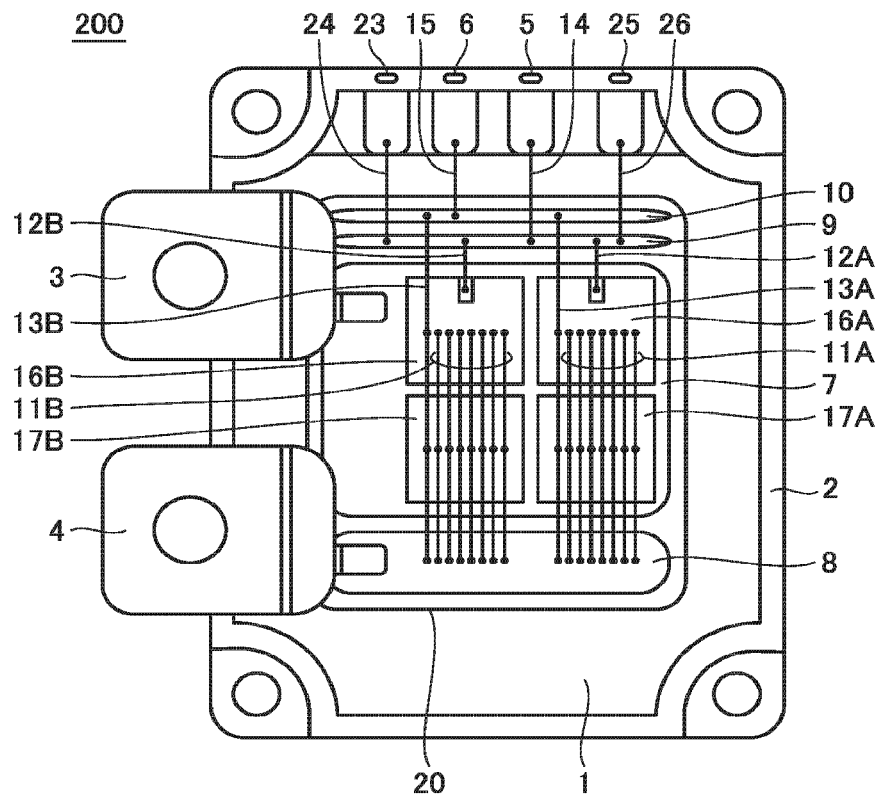
FIG. 15 is a plan view schematically illustrating the inner configuration of a power semiconductor module according to a modification of the first embodiment.

FIG. 15 is a plan view schematically illustrating the inner configuration of a power semiconductor module according to a modification of the first embodiment. With reference to FIG. 15, in addition to the configuration of the power semiconductor module 100 illustrated in FIG. 2, the power semiconductor module 200 further includes a filter terminal 25. The filter terminal 25 is formed on the housing 2 through insert-molding or outsert-molding together with the gate control terminal 5, the emitter control terminal 6 and the filter terminal 23, and is connected to the gate control wiring pattern 9 via a wire 26. Then, a capacitor 64 or the like is connected between the filter terminals 23 and 25 outside the housing 2, whereby a filter is formed relative to the gate control wiring pattern 9.

Figure 16:
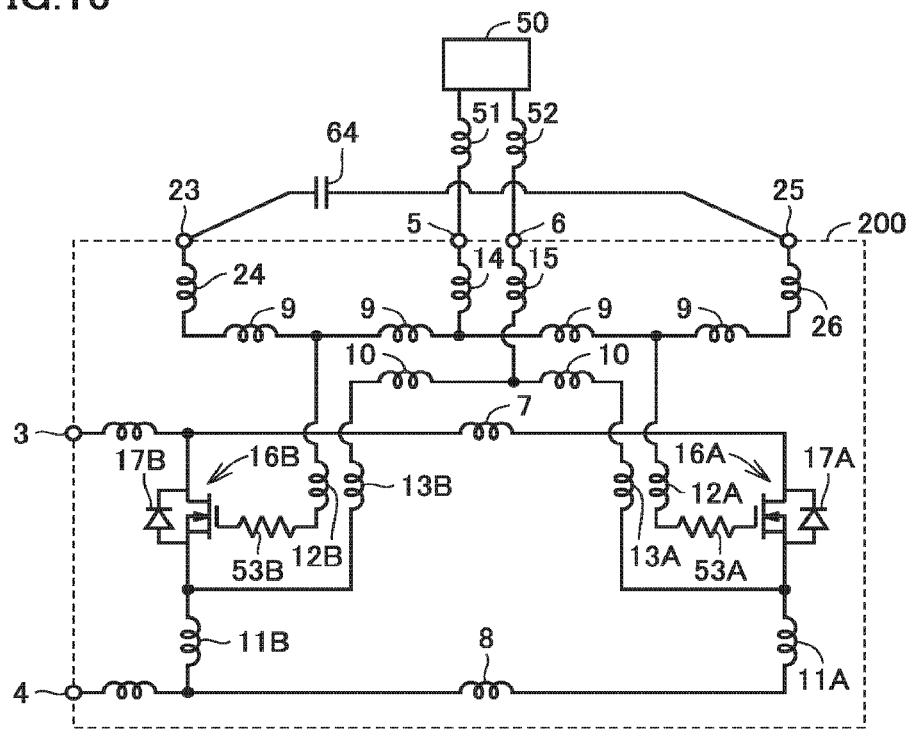
FIG. 16 is an equivalent circuit diagram illustrating the electrical configuration of a power semiconductor module according to a modification of the first embodiment.

FIG. 16 is an equivalent circuit diagram illustrating the electrical configuration of the power semiconductor module 200 according to the modification of the first embodiment. With reference to FIG. 16, the filter terminal 25 is further connected to the gate control wiring pattern 9 via the wire 26. Then, the capacitor 64 is connected between the filter terminals 23 and 25 outside the power semiconductor module 200, whereby an LC parallel resonance circuit is formed by the capacitance of the capacitor 64 and the inductance of the gate control wiring pattern 9 so as to suppress the gate oscillation occurring in the gate control wiring pattern 9.

In the present modification, the filter terminals 23 and 25 are connected to the gate control wiring pattern 9 in such a manner that a section electrically connected to the filter terminals 23 and 25 on the gate control wiring pattern 9 includes the entire section electrically connected to the gates of the semiconductor switching elements 16A and 16B on the gate control wiring pattern 9.

Figure 17:
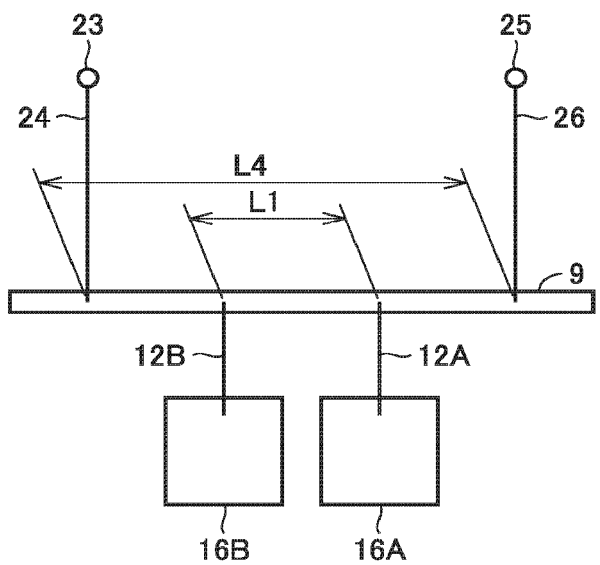
FIG. 17 is a view for explaining how a filter terminal is connected to a gate control wiring pattern in a modification of the first embodiment.

FIG. 17 is a view for explaining how the filter terminals 23 and 25 are connected to the gate control wiring pattern 9 in the modification of the first embodiment. With reference to FIG. 17, the filter terminals 23 and 25 are connected to the gate control wiring pattern 9 in such a manner that a section L4 between the filter terminals 23 and 25 on the gate control wiring pattern 9 includes the entire connection section L1 between the semiconductor switching elements 16A and 16B.

By providing the filter terminals 23 and 25 in such a manner, when the capacitor 64 (FIG. 16) is connected between the filter terminals 23 and 25, it is possible to form a filter (LC parallel resonance circuit) so as to effectively suppress the gate oscillation occurring between the semiconductor switching elements 16A and 16B A.

Although not specifically shown in the drawings, in the present modification, similar to that described with reference to FIGS. 10 and 12, a resistor 65 may be further connected between the filter terminals 23 and 25 in addition to the capacitor 64, or a self-arc-extinguishing type semiconductor switching element 66 may be connected between the filter terminals 23 and 25 to replace the capacitor 64.

As described above, according to the present modification, a filter may be provided and adjusted outside the module so as to effectively suppress the gate oscillation occurring between the semiconductor switching elements 16A and 16B.

Second Embodiment

In the first embodiment mentioned above, it is described that a filter is formed relative to the gate control wiring pattern 9 so as to suppress the gate oscillation. When the semiconductor switching elements 16A and 16B operate in parallel, oscillation may occur between the semiconductor switching elements 16A and 16B due to the parasitic capacitance of the semiconductor switching elements 16A and 16B and the parasitic inductance of the wiring connecting the semiconductor switching elements 16A and 16B. Thus, the collector wiring pattern 7 may become an oscillation path, and the oscillation in the path may result in gate oscillation. Therefore, in the second embodiment, a filter is formed relative to the collector wiring pattern 7 so as to suppress the oscillation.

In the present embodiment, in order to measure an internal voltage of the power semiconductor module, a collector sensing terminal is provided so as to obtain a potential at a location closer to the semiconductor switching elements 16A, 16B than the positive electrode 3. The collector sensing terminal is connected to the collector wiring pattern 7 by wires. Thus, the voltage actually applied to the semiconductor switching elements 16A, 16B may be measured by measuring the voltage between the collector sensing terminal and the emitter control terminal 6 (FIG. 2).

In the second embodiment, a collector sensing terminal is provided. In the second embodiment, in addition to the collector sensing terminal, a filter terminal is further provided in connection with the collector wiring pattern 7, and a capacitor or the like is connected between the collector sensing terminal and the filter terminal outside the housing 2 so as to form a filter relative to the collector wiring pattern 7.

Figure 18:
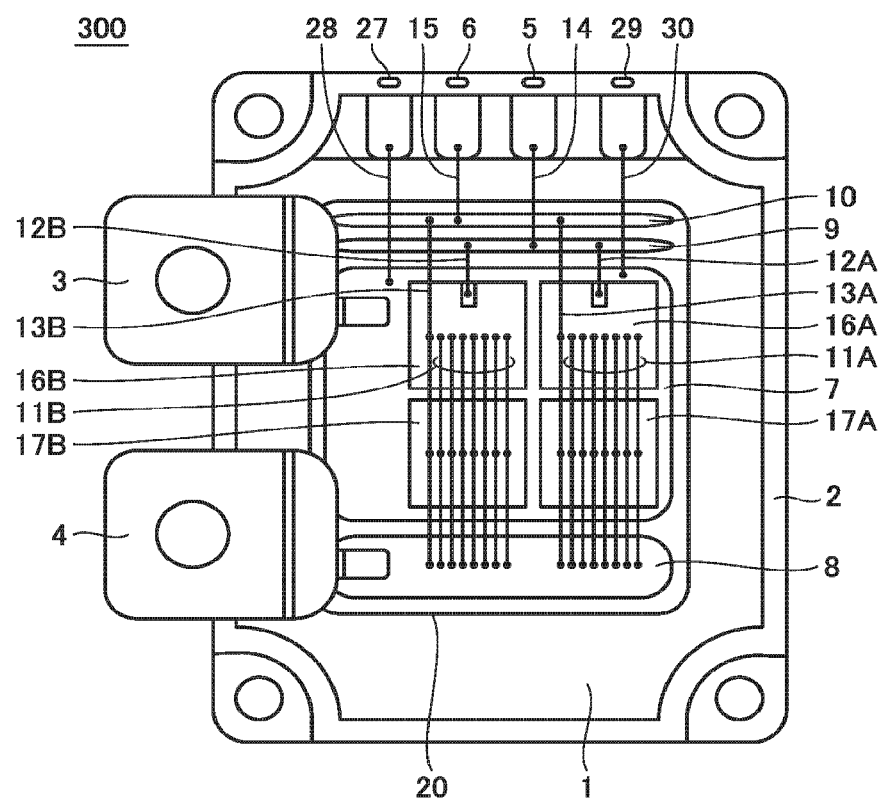
FIG. 18 is a plan view schematically illustrating the inner configuration of a power semiconductor module according to a second embodiment.

FIG. 18 is a plan view schematically illustrating the inner configuration of the power semiconductor module according to the second embodiment. FIG. 18 corresponds to FIG. 2 described in the first embodiment. With reference to FIG. 18, in addition to the configuration of the power semiconductor module 100 illustrated in FIG. 2, the power semiconductor module 300 further includes a collector sensing terminal 27, and a filter terminal 29 in place of the filter terminal 23.

Similarly, the collector sensing terminal 27 and the filter terminal 29 are formed on the housing 2 through insert-molding or outsert-molding together with the gate control terminal 5 and the emitter control terminal 6, and are connected to the collector wiring pattern 7 via wires 28 and 30, respectively. Then, a filter is formed relative to the collector wiring pattern 7 by connecting a capacitor or the like (not shown) between the collector sensing terminal 27 and the filter terminal 29 outside the housing 2.

Figure 19:
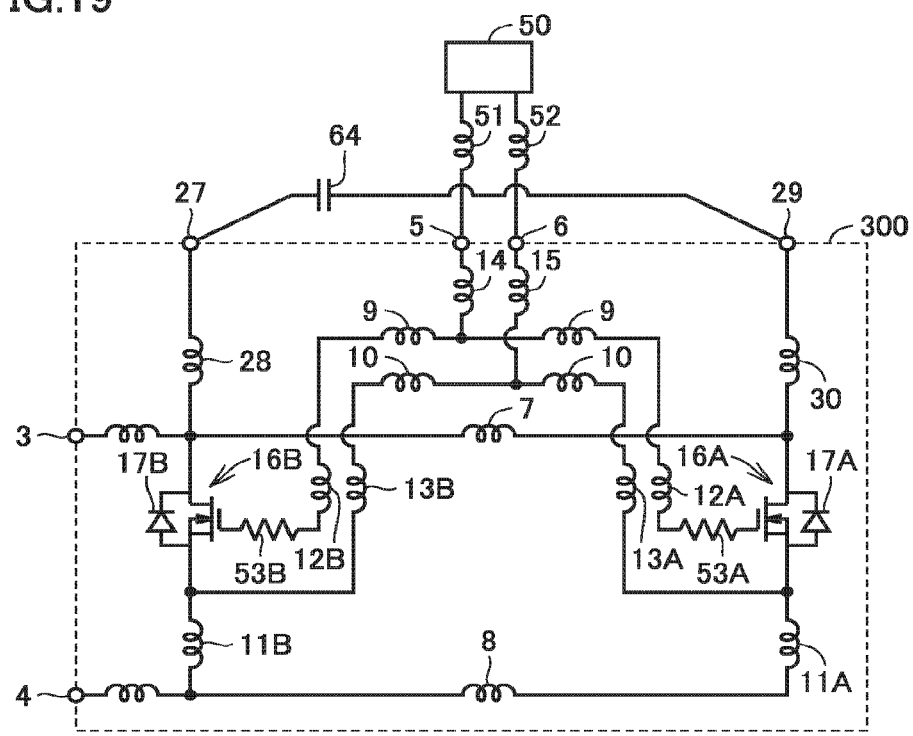
FIG. 19 is an equivalent circuit diagram illustrating the electrical configuration of the power semiconductor module according to the second embodiment.

FIG. 19 is an equivalent circuit diagram illustrating the electrical configuration of the power semiconductor module 300 according to the second embodiment. With reference to FIG. 19, the collector sensing terminal 27 is connected to the collector wiring pattern 7 via the wire 28. In the power semiconductor module 300 according to the second embodiment, the filter terminal 29 is further connected to the collector wiring pattern 7 via the wire 30.

Then, the capacitor 64 is connected between the collector sensing terminal 27 and the filter terminal 29 outside the power semiconductor module 300, and whereby an LC parallel resonance circuit is formed by the capacitance of the capacitor 64 and the inductance of the collector wiring pattern 7 so as to suppress the oscillation occurring in the collector wiring pattern 7.

In the present embodiment, the collector sensing terminal 27 and the filter terminal 29 are connected to the collector wiring pattern 7 in such manner that a section electrically connected to the collector sensing terminal 27 and the filter terminal 29 on the collector wiring pattern 7 includes at least a part of a current-carrying region on the collector wiring pattern 7 when the semiconductor switching elements 16A and 16B are operating in parallel.

Specifically, with reference to FIG. 18 again, when the semiconductor switching elements 16A and 16B are operating in parallel, the current-carrying region on the collector wiring pattern 7 is not strictly limited to a region between the junction of the semiconductor switching elements 16A and 16B and the junction of the positive electrode 3, it also includes those formed around the semiconductor switching elements 16A and 16B on the collector wiring pattern 7. The collector sensing terminal 27 and the filter terminal 29 are connected to the collector wiring pattern 7 so as to include at least a part of the current-carrying region. As illustrated in FIG. 18, in order to form a filter effective in suppressing the oscillation occurring in the collector wiring pattern 7, it is preferred that the filter terminal 29 is disposed close to the semiconductor switching elements 16A and 16B, and separated from the collector sensing terminal 27 in a direction along which the semiconductor switching elements 16A are 16B are arrayed.

In the above, it is described that the LC parallel resonance circuit is formed as a filter by connecting the capacitor 64 between the collector sensing terminal 27 and the filter terminal 29. However, similar to the filter illustrated in FIG. 10 or FIG. 12, a resistor may be further connected between the collector sensing terminal 27 and the filter terminal 29 to form an LCR parallel resonance circuit, or a filter may be formed by connecting a semiconductor switching element between the collector sensing terminal 27 and the filter terminal 29.

As described above in the second embodiment, the collector sensing terminal 27 and the filter terminal 29 are connected to the collector wiring pattern 7 in such manner that a section electrically connected to the collector sensing terminal 27 and the filter terminal 29 on the collector wiring pattern 7 includes at least a part of a current-carrying region on the collector wiring pattern 7 when the semiconductor switching elements 16A and 16B are operating in parallel. Thus, a filter may be formed by connecting the capacitor 64 between the collector sensing terminal 27 and the filter terminal 29 outside the housing 2 so as to reduce the oscillation occurring between the semiconductor switching elements 16A and 16B. Therefore, according to the second embodiment, a filter may be provided and adjusted outside the module so as to suppress the gate oscillation by reducing the oscillation occurring in the collector wiring pattern 7.

Third Embodiment

As described above, when the semiconductor switching elements 16A and 16B operate in parallel, oscillation may occur between the semiconductor switching elements 16A and 16B. Thus, the emitter wiring pattern 8 may become an oscillation path, and the oscillation in the path may result in the gate oscillation. Therefore, in the third embodiment, a filter is formed relative to the emitter wiring pattern 8 so as to suppress the oscillation.

In the present embodiment, in order to detect a current flowing through the power semiconductor module, an emitter sensing terminal is provided to obtain a potential at a location closer to the semiconductor switching elements 16A, 16B than the negative electrode 4. The emitter sensing terminal is connected to the emitter wiring pattern 8 by wires. When a current flows through the parasitic inductance between the emitter sensing terminal and the negative electrode 4, the voltage drops in accordance with the temporal change of the current and the parasitic inductance, and thus, the current may be detected by detecting the voltage drop.

In the third embodiment, an emitter sensing terminal is provided. In the third embodiment, in addition to the emitter sensing terminal, a filter terminal is further provided in connection with the emitter wiring pattern 8, and a capacitor is connected between the emitter sensing terminal and the filter terminal outside the housing 2 so as to form a filter relative to the emitter wiring pattern 8.

Figure 20:
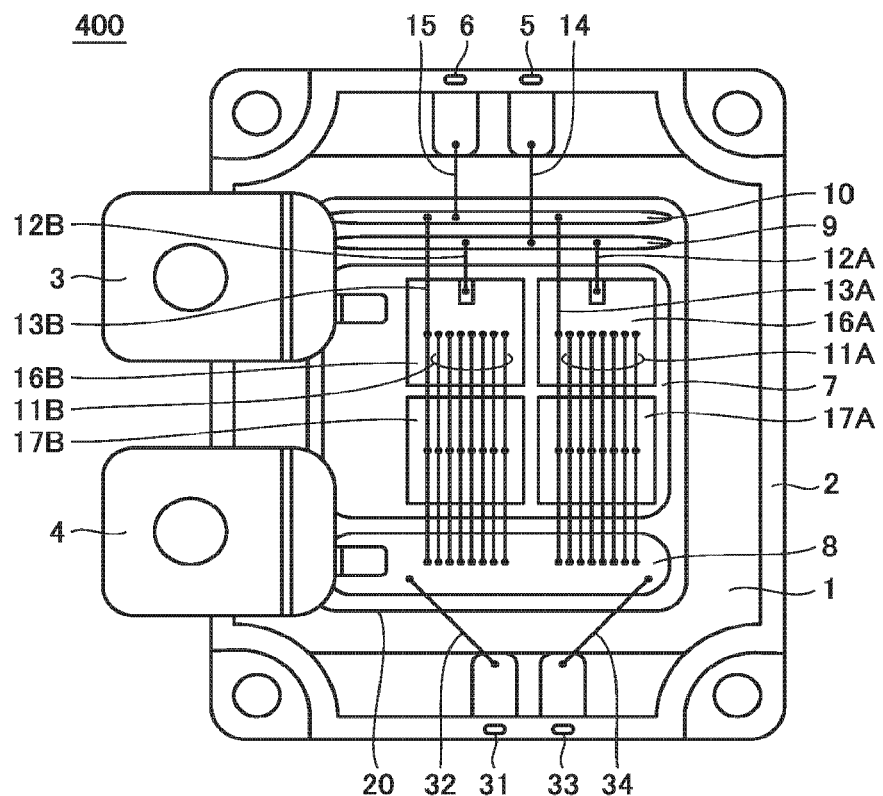
FIG. 20 is a plan view schematically illustrating the inner configuration of a power semiconductor module according to a third embodiment.

FIG. 20 is a plan view schematically illustrating the inner configuration of the power semiconductor module according to the third embodiment. FIG. 20 corresponds to FIG. 2 described in the first embodiment. With reference to FIG. 20, in addition to the configuration of the power semiconductor module 100 illustrated in FIG. 2, the power semiconductor module 400 further includes an emitter sensing terminal 31, and a filter terminal 33 in place of the filter terminal 23.

Similarly, the emitter sensing terminal 31 and the filter terminal 33 are formed on the housing 2 through insert-molding or outsert-molding together with the gate control terminal 5 and the emitter control terminal 6, and are connected to the emitter wiring pattern 8 via wires 32 and 34, respectively. Then, a filter is formed relative to the emitter wiring pattern 8 by connecting a capacitor or the like (not shown) between the emitter sensing terminal 31 and the filter terminal 33 outside the housing 2.

Figure 21:
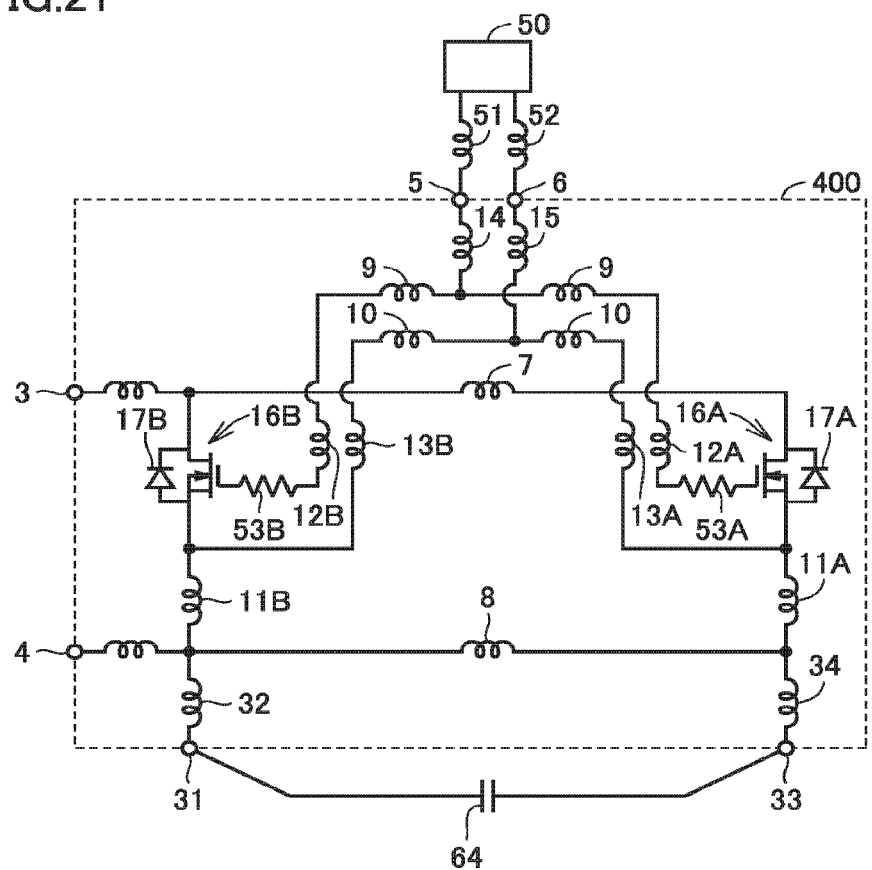
FIG. 21 is an equivalent circuit diagram illustrating the electrical configuration of the power semiconductor module according to the third embodiment.

FIG. 21 is an equivalent circuit diagram illustrating the electrical configuration of the power semiconductor module 400 according to the third embodiment. With reference to FIG. 21, the emitter sensing terminal 31 is connected to the emitter wiring pattern 8 through the wire 32. In the power semiconductor module 400 according to the third embodiment, the filter terminal 33 is further connected to the emitter wiring pattern 8 via the wire 34.

Then, the capacitor 64 is connected between the emitter sensing terminal 31 and the filter terminal 33 outside the power semiconductor module 400, and whereby an LC parallel resonance circuit is formed by the capacitance of the capacitor 64 and the inductance of the emitter wiring pattern 8 so as to suppress the oscillation occurring in the emitter wiring pattern 8.

In the present embodiment, the emitter sensing terminal 31 and the filter terminal 33 are connected to the emitter wiring pattern 8 in such a manner that a section electrically connected to the emitter sensing terminal 31 and the filter terminal 33 on the emitter wiring pattern 8 includes at least a part of a current-carrying region on the emitter wiring pattern 8 when the semiconductor switching elements 16A and 16B are operating in parallel.

Specifically, with reference to FIG. 20 again, when the semiconductor switching elements 16A and 16B are operating in parallel, the current-carrying region on the emitter wiring pattern 8 is not strictly limited to a region between the connection of the emitter wires 11A, 11B and the junction of the negative electrode 4, it also includes those formed around the connection of the emitter wires 11A and 11B on the emitter wiring pattern 8. The emitter sensing terminal 31 and the filter terminal 33 are connected to the emitter wiring pattern 8 so as to include at least a part of the current-carrying region. As illustrated in FIG. 20, in order to form a filter effective in suppressing the oscillation occurring in the emitter wiring pattern 8, it is preferred that the filter terminal 33 is disposed close to the emitter wires 11A and 11B, and separated from the emitter sensing terminal 31 in a direction along which the emitter wires 11A and 11B are arrayed.

In the above, it is described that an LC parallel resonance circuit is formed as a filter by connecting the capacitor 64 between the emitter sensing terminal 31 and the filter terminal 33. However, similar to the filter illustrated in FIG. 10 or FIG. 12, a resistor may be further connected between the emitter sensing terminal 31 and the filter terminal 33 to form an LCR parallel resonance circuit, or a filter may be formed by connecting a semiconductor switching element between the emitter sensing terminal 31 and the filter terminal 33.

As described above in the third embodiment, the emitter sensing terminal 31 and the filter terminal 33 are connected to the emitter wiring pattern 8 in such a manner that a section electrically connected to the emitter sensing terminal 31 and the filter terminal 33 on the emitter wiring pattern 8 includes at least a part of a current-carrying region on the emitter wiring pattern 8 when the semiconductor switching elements 16A and 16B are operating in parallel. Thus, a filter may be formed by connecting the capacitor 64 between the emitter sensing terminal 31 and the filter terminal 33 outside the housing 2 so as to reduce the oscillation occurring between the semiconductor switching elements 16A and 16B. Therefore, according to the third embodiment, a filter may be provided and adjusted outside the module so as to suppress the gate oscillation by reducing the oscillation occurring in the emitter wiring pattern 8.

Fourth Embodiment

In a power semiconductor device including the power semiconductor modules operating in parallel according to the fourth embodiment, a filter is provided outside the modules so as to suppress the oscillation occurring inside and outside the power semiconductor modules.

Figure 22:
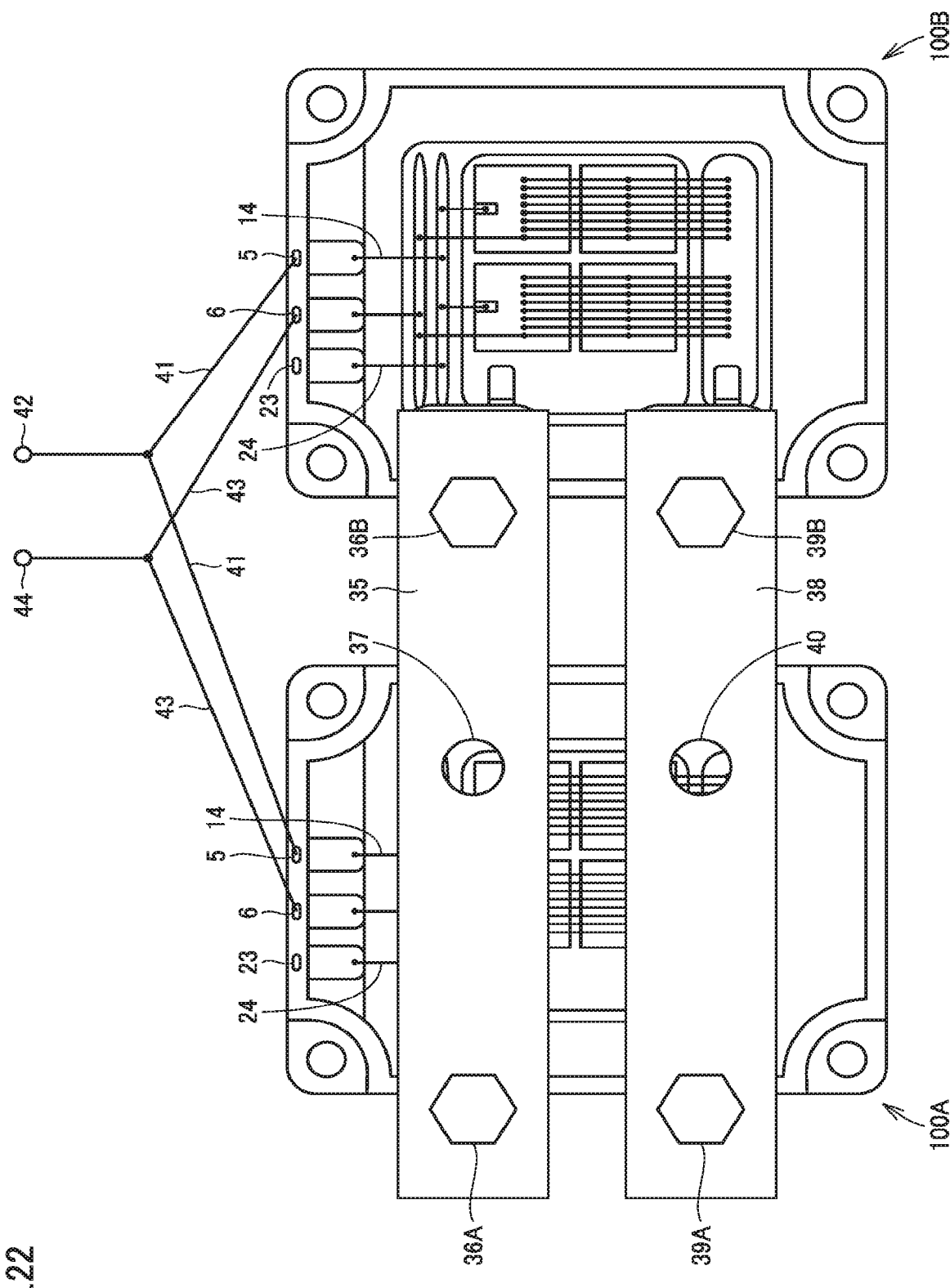
FIG. 22 is a plan view schematically illustrating the configuration of a power semiconductor device according to a fourth embodiment.

FIG. 22 is a plan view schematically illustrating the configuration of a power semiconductor device according to the fourth embodiment. With reference to FIG. 22, the power semiconductor device includes power semiconductor modules 100A and 100B, bus bars 35 and 38, a driver gate control wiring 41, a driver emitter control wiring 43, and driver terminals 42 and 44. Each of the power semiconductor modules 100A and 100B is the same as the power semiconductor module 100 described in the first embodiment.

The bus bars 35, 38 are conductors used to connect the power semiconductor modules 100A and 100B. The bus bar 35 is fixed to the positive electrode 3 of each of the power semiconductor modules 100A and 100B by bolts 36A and 36B, and the bus bar 38 is fixed to the negative electrode 4 of each of the power semiconductor modules 100A and 100B by bolts 39A and 39B. A terminal 37 formed on the bus bar 35 is a collector terminal to be connected to an external circuit (not shown), and a terminal 40 formed on the bus bar 38 is an emitter terminal to be connected to an external circuit.

The gate control terminal 5 of each of the power semiconductor modules 100A and 100B is connected to the driver terminal 42 via the driver gate control wiring 41. The emitter control terminal 6 of each of the power semiconductor modules 100A and 100B is connected to the driver terminal 44 via the driver emitter control wiring 43. The driver terminals 42 and 44 are connected to a driver (not shown).

When the power semiconductor modules 100A and 100B are operating in parallel, oscillation may occur between the modules. The gate oscillation occurring in the gate control wiring 41 used to connect the power semiconductor modules 100A and 100B may be suppressed by, for example, connecting a capacitor or the like between the gate control terminal 5 of the power semiconductor module 100A and the gate control terminal 5 of the power semiconductor module 100B. However, in this case, it is impossible to suppress the gate oscillation between the elements operating in parallel in each of the power semiconductor modules 100A and 100B as in the first embodiment.

Thus, in the power semiconductor device according to the fourth embodiment, a filter forming element such as a capacitor or the like may be connected between the filter terminal 23 of the power semiconductor module 100A and the filter terminal 23 of the power semiconductor module 100B so as to suppress the gate oscillation occurring in the driver gate control wiring 41 while suppressing the gate oscillation between the elements operating in parallel in each of the power semiconductor modules 100A and 100B.

Figure 23:
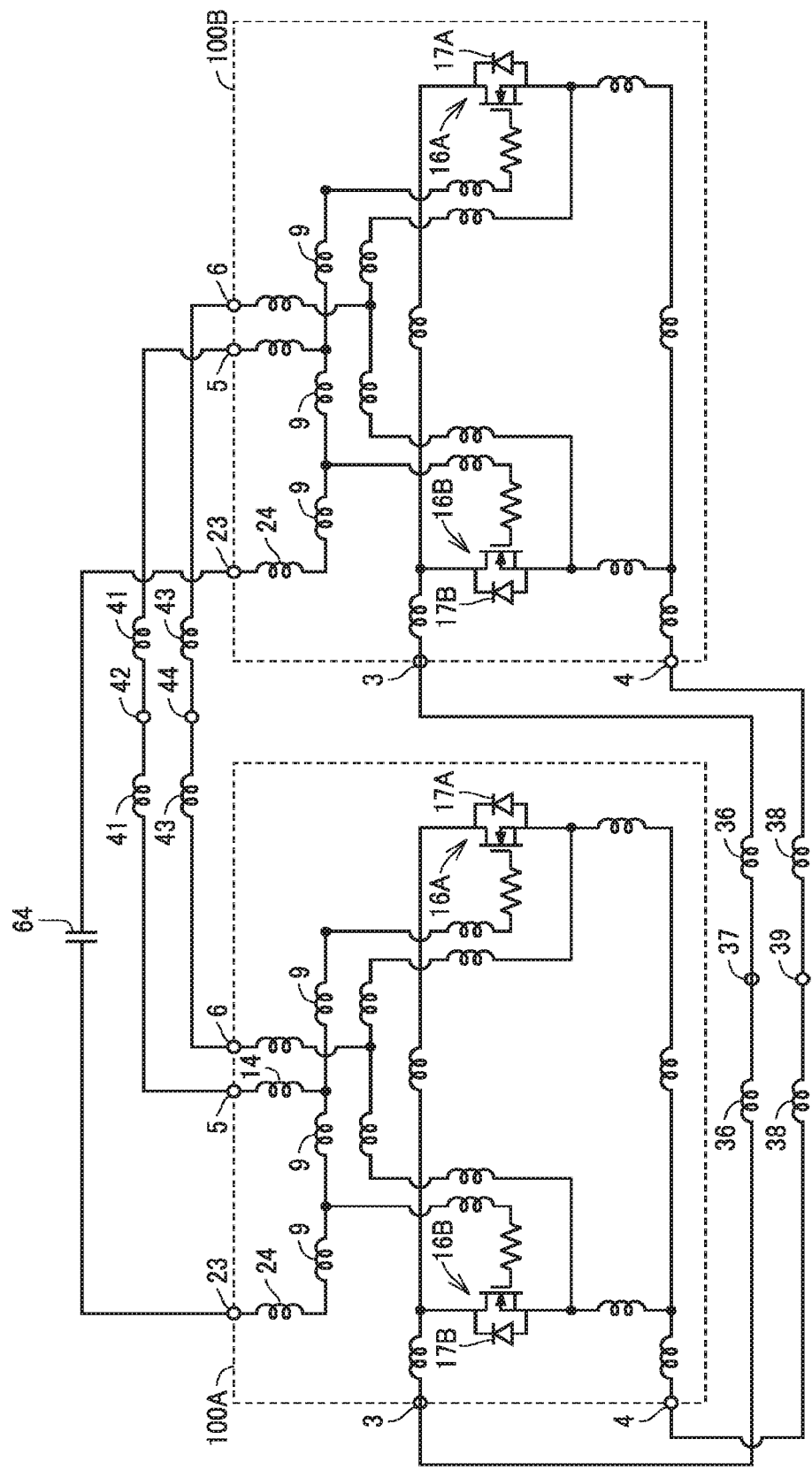
FIG. 23 is an equivalent circuit diagram illustrating the electrical configuration of the power semiconductor device according to the fourth embodiment.

FIG. 23 is an equivalent circuit diagram illustrating the electrical configuration of the power semiconductor device according to the fourth embodiment. With reference to FIG. 23, the filter terminal 23 in each of power semiconductor modules 100A and 100B is connected to the gate control wiring pattern 9 via the wire 24. Then, the capacitor 64 outside the power semiconductor modules 100A and 100B is connected between the filter terminal 23 of the power semiconductor module 100A and the filter terminal 23 of the power semiconductor module 100B. The gate control terminal 5 of the power semiconductor module 100A and the gate control terminal 5 of the power semiconductor module 100B are electrically connected via the driver gate control wiring 41 and the driver terminal 42.

Thereby, an LC parallel resonance circuit including the gate control wiring pattern 9 of the power semiconductor module 100A, the driver gate control wiring 41, the gate control wiring pattern 9 of the power semiconductor module 100B, and the capacitor 64 is formed so as to suppress the gate oscillation occurring in the gate control wiring pattern 9 in each module and the driver gate control wiring 41 used to connect the power semiconductor modules 100A and 100B.

In the above, it is described that an LC parallel resonance circuit is formed as a filter by connecting the capacitor 64 between the filter terminal 23 of the power semiconductor module 100A and the filter terminal 23 of the power semiconductor module 100B. However, similar to the filter illustrated in FIG. 10 or FIG. 12, a resistor may be connected in parallel to the capacitor 64 to form an LCR parallel resonance circuit, or a filter may be formed by using a semiconductor switching element in place of the capacitor 64.

As described above, according to the fourth embodiment, by connecting the capacitor 64 between the filter terminal 23 of the power semiconductor module 100A and the filter terminal 23 of the power semiconductor module 100B, a filter may be provided and adjusted outside the module so as to suppress the oscillation occurring between the modules and reduce the gate oscillation in each module. Further, according to the fourth embodiment, the gate resistance may be minimized or dispensed with, which makes it possible to prevent the switching speed from being lowered by the gate resistance.

Fifth Embodiment

In each of the embodiments described above, the power semiconductor module is formed as a so-called 1-in-1 module which includes a plurality of semiconductor switching elements operating in parallel and a plurality of freewheel diodes corresponding thereto. In the fifth embodiment, the power semiconductor module is formed as a so-called 2-in-1 module which includes an upper arm and a lower arm connected in series, and each arm is constituted by a plurality of semiconductor switching elements operating in parallel and a plurality of freewheel diodes corresponding thereto.

Figure 24:
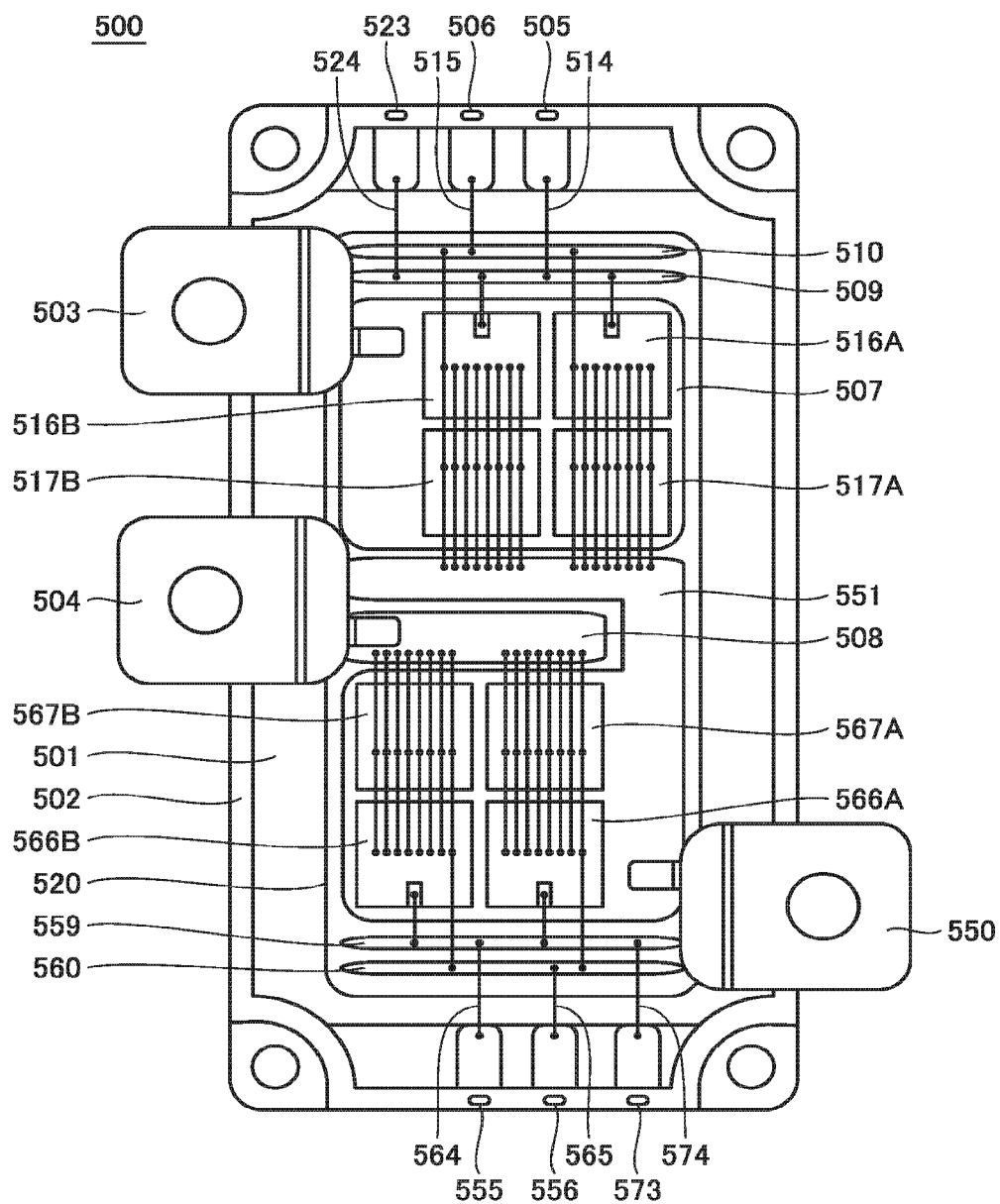
FIG. 24 is a plan view schematically illustrating the inner configuration of a power semiconductor module according to a fifth embodiment.

FIG. 24 is a plan view schematically illustrating the inner configuration of the power semiconductor module according to the fifth embodiment. With reference to FIG. 24, the power semiconductor module 500 includes a base plate 501, a housing 502, a positive electrode 503, a negative electrode 504, and an AC electrode 550. The positive electrode 503, the negative electrode 504, and the AC electrode 550 are exposed to the outside of the housing 502, and are connected to a positive electrode bus bar, a negative electrode bus bar, and an AC bus bar (none is shown in the figure), respectively.

The power semiconductor module 500 further includes an insulating substrate 520, a collector wiring pattern 507, an AC wiring pattern 551, an emitter wiring pattern 508, gate control wiring patterns 509 and 559, an AC control wiring pattern 510, an emitter control wiring pattern 560, semiconductor switching elements 516 A, 516 B, 566 A and 566 B, and freewheel diodes 517A, 517B, 567A and 567B.

The power semiconductor module 500 is a 2-in-1 module including an upper arm and a lower arm connected in series in the housing 502. Specifically, the upper arm is formed of the semiconductor switching elements 516A and 516B operating in parallel and the corresponding freewheel diodes 517A and 517B, the lower arm is formed of the semiconductor switching elements 566A and 566B operating in parallel and the corresponding freewheel diodes 567A and 567B, and the upper arm and the lower arm are connected in series.

The configuration of each of the semiconductor switching elements 516A, 516B, 566A and 566B is the same as that of the semiconductor switching element 16A (16B) in each of the above embodiments, and the configuration of each of the freewheel diodes 517A, 517B, 567A and 567B is the same as that of the freewheel diode 17A (17B) in each of the above embodiments.

The power semiconductor module 500 further includes gate control terminals 505 and 555, an AC control terminal 506, and an emitter control terminal 556. Each of these terminals is formed on the housing 502 through insert-molding or outsert-molding. The gate control terminal 505 is connected to the gate control wiring pattern 509 via a wire 514, and the AC control terminal 506 is connected to the AC control wiring pattern 510 via a wire 515. The gate control terminal 555 is connected to the gate control wiring pattern 559 via a wire 564, and the emitter control terminal 556 is connected to the emitter control wiring pattern 560 via a wire 565.

The power semiconductor module 500 according to the fifth embodiment further includes filter terminals 523 and 573 for forming a filter which may be adjusted outside the housing so as to suppress the gate oscillation. The filter terminals 523 and 573 are formed on the housing 502 through insert-molding or outsert-molding together with the other terminals.

The filter terminal 523 is connected to the gate control wiring pattern 509 via a wire 524. Thereby, a filter may be formed relative to the gate control wiring pattern 509 of the upper arm by connecting a capacitor (not shown) between the gate control terminal 505 and the filter terminal 523 outside the housing 502.

Meanwhile, the filter terminal 573 is connected to the gate control wiring pattern 559 via a wire 574. Thereby, a filter may be formed relative to the gate control wiring pattern 559 of the lower arm by connecting a capacitor (not shown) between the gate control terminal 555 and the filter terminal 573 outside the housing 502.

Figure 25:
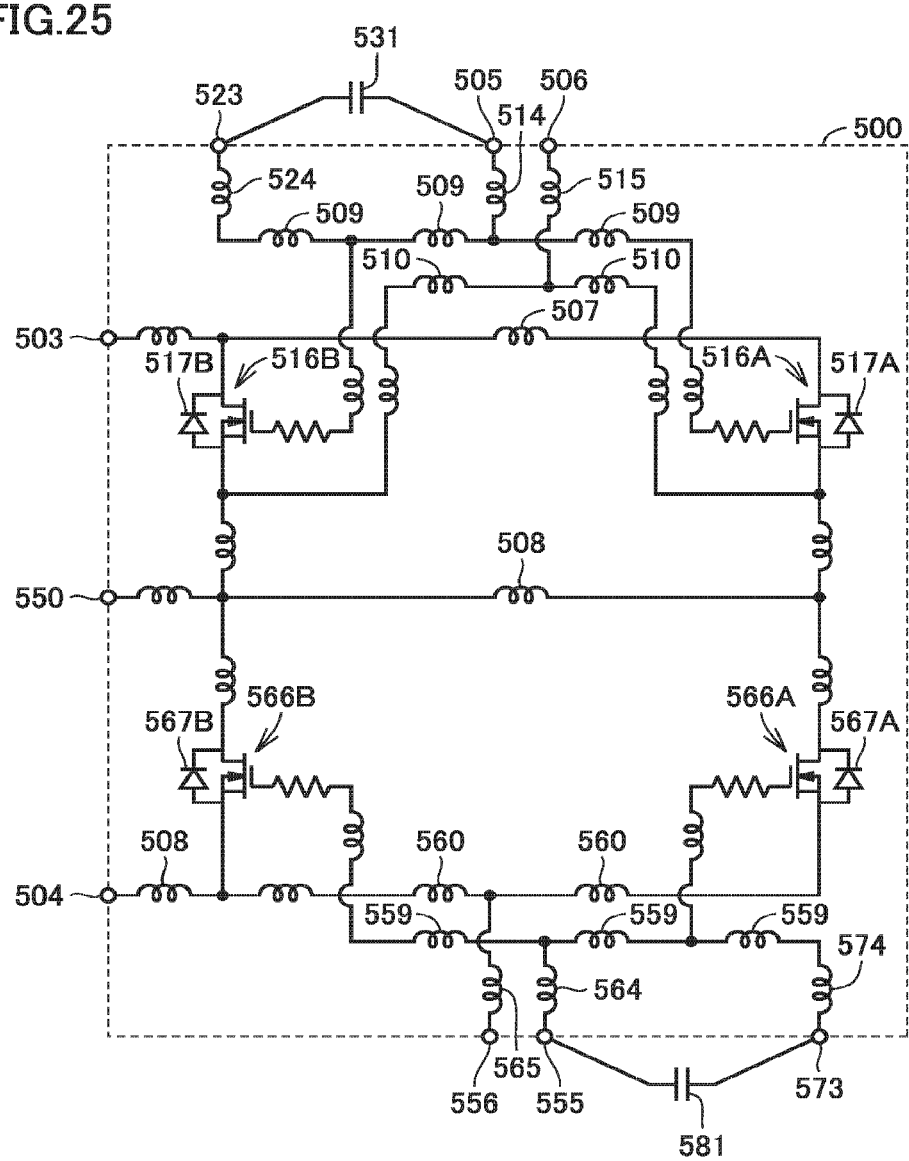
FIG. 25 is an equivalent circuit diagram illustrating the electrical configuration of the power semiconductor module according to the fifth embodiment.

FIG. 25 is an equivalent circuit diagram illustrating the electrical configuration of a power semiconductor module 500 according to the fifth embodiment. With reference to FIG. 25, the gate control wiring pattern 509 of the upper arm is connected to the gate control terminal 505 via a wire 514, and is further connected to the filter terminal 523 via a wire 524. In the present embodiment, the filter terminal 523 is connected to the gate control wiring pattern 509 in such a manner that a section electrically connected to the gate control terminal 505 and the filter terminal 523 on the gate control wiring pattern 509 overlaps with at least a part of a section electrically connected to the gates of the semiconductor switching elements 516A and 516B on the gate control wiring pattern 509. Then, a capacitor 531 is connected between the gate control terminal 505 and the filter terminal 523 outside the power semiconductor module 500, and whereby an LC parallel resonance circuit is formed by the capacitance of the capacitor 531 and the inductance of the gate control wiring pattern 509 so as to suppress the gate oscillation occurring in the gate control wiring pattern 509.

Similarly, the gate control wiring pattern 559 of the lower arm is connected to the gate control terminal 555 via a wire 564, and is further connected to the filter terminal 573 via a wire 574. In the present embodiment, the filter terminal 573 is connected to the gate control wiring pattern 559 in such a manner that a section electrically connected to the gate control terminal 555 and the filter terminal 573 on the gate control wiring pattern 559 overlaps with at least a part of a section electrically connected to the gates of the semiconductor switching elements 566A and 566B on the gate control wiring pattern 559. Then, a capacitor 581 is connected between the gate control terminal 555 and the filter terminal 573 outside the power semiconductor module 500, and whereby an LC parallel resonance circuit is formed by the capacitance of the capacitor 581 and the inductance of the gate control wiring pattern 559 so as to suppress the gate oscillation occurring in the gate control wiring pattern 559.

Although not specifically shown in the drawings, in the fifth embodiment, similar to that described with reference to FIGS. 10 and 12, a resistor may be connected between the gate control terminal 505 and the filter terminal 523 in addition to the capacitor 531, or a self-arc-extinguishing type semiconductor switching element may be connected between the gate control terminal 505 and the filter terminal 531 to replace the capacitor 523. Similarly, a resistor may be connected between the gate control terminal 555 and the filter terminal 573 in addition to the capacitor 581, or a self-arc-extinguishing type semiconductor switching element may be connected between the gate control terminal 555 and the filter terminal 573 to replace the capacitor 581.

As described above, according to the fifth embodiment, even in a 2-in-1 power semiconductor module, a filter may be provided and adjusted outside the module so as to suppress the gate oscillation occurring between the semiconductor switching elements 516A and 516B constituting the upper arm and the gate oscillation occurring between the semiconductor switching elements 566A and 566B constituting the lower arm.

In the 2-in-1 power semiconductor module of the fifth embodiment, as in the modification of the first embodiment, it is acceptable that an existing gate control terminal may not be used, and a plurality of filter terminals may be provided and used instead.

Further, in the 2-in-1 module described above, a filter may be formed relative to the collector wiring pattern so as to suppress the oscillation as in the second embodiment, a filter may be formed relative to the emitter wiring pattern so as to suppress the oscillation as in the third embodiment. In addition, a filter a filter may be formed relative to the AC wiring pattern so as to suppress the oscillation.

Furthermore, in the fourth embodiment, each of the plurality of power semiconductor modules constituting the power semiconductor device may be constituted by a 2-in-1 module.

In each of the embodiments mentioned above, it is described that the semiconductor switching elements 16A, 16B, 516A, 516B, 566A, 566B and the freewheel diodes 17A, 17B, 517A, 517B, 567A, 567B each is made of a wide band gap semiconductor, the present invention is not limited to a power semiconductor module made of a wide band gap semiconductor, the power semiconductor module may be made of conventional silicon-based semiconductor elements.

It is intended that the embodiments disclosed herein are to be carried out in any appropriate combination with no contradiction. The embodiments disclosed herein are merely by way of example and not limited thereto. The scope of the present invention is defined by the terms of the claims, rather than the description above, and is intended to include any modifications within the meaning and scope equivalent to the terms of the claims.

REFERENCE SIGNS LIST 1, 501: base plate; 2, 502: housing; 3, 503: positive electrode; 4, 504: negative electrode; 5, 505, 555: gate control terminal (external terminal); 6, 556: emitter control terminal (external terminal); 7, 507: collector wiring pattern; 8, 508: emitter wiring pattern; 9, 509, 559: gate control wiring pattern; 10, 560: emitter control wiring pattern; 11A, 11B: emitter wire; 12A, 12B: gate control wire; 13A, 13B: emitter control wire; 14, 15, 24, 26, 28, 30, 32, 34: wire; 16A, 16B, 516A, 516B, 566A, 566B: semiconductor switching element; 17A, 17B, 517A, 517B, 567A, 567B: freewheel diode; 18, 22: solder; 19: wiring pattern; 20: insulating substrate; 21: back surface pattern; 23, 25, 29, 33, 523, 573: filter terminal; 27: collector sensing terminal; 31: emitter sensing terminal; 35, 38: bus bar; 36A, 36B, 39A, 39B: bolt; 37, 40: terminal; 41: driver gate control wiring; 42, 44: driver terminal; 43: driver emitter control wiring; 64, 531, 581: capacitor; 65, 68: resistor; 66: semiconductor switching element; 67: rectifying type semiconductor element; 100, 100A, 100B, 200, 300, 400, 500: power semiconductor module; 506: AC control terminal; 510: AC control wiring pattern; 550: AC electrode; 551: AC wiring pattern

The invention claimed is:
1. A power semiconductor module comprising:
a first plurality of semiconductor elements configured to operate in parallel;
a housing configured to house the first plurality of semiconductor elements; and
a first external terminal and a second external terminal connected to a first wiring which is connected by respective terminals of the first plurality of semiconductor elements, and configured to electrically connect a first filter forming element provided outside the housing to the first wiring,
the first external terminal and the second external terminal being electrically connected to the first wiring in such a manner that a section electrically connecting the first external terminal and the second external terminal on the first wiring includes at least a part of a current-carrying region on the first wiring when the first plurality of semiconductor elements are operating in parallel.
2. The power semiconductor module according to claim 1, wherein
the first external terminal and the second external terminal are connected to the first wiring in such a manner that the section overlaps with at least a part of a section electrically connecting the respective terminals on the first wiring.
3. The power semiconductor module according to claim 1, further comprising a capacitor which is electrically connected between the first external terminal and the second external terminal outside the housing and constitutes the first filter forming element.
4. The power semiconductor module according to claim 3, further comprising a resistor which is electrically connected in series to the capacitor outside the housing and constitutes the first filter forming element.
5. The power semiconductor module according to claim 3, further comprising a resistor which is electrically connected in parallel to the capacitor outside the housing and constitutes the first filter forming element.
6. The power semiconductor module according to claim 1, further comprising a rectifying type semiconductor element which is electrically connected between the first external terminal and the second external terminal outside the housing and constitutes the first filter forming element.
7. The power semiconductor module according to claim 6, further comprising a resistor which is electrically connected in parallel to the rectifying type semiconductor element outside the housing and constitutes the first filter forming element.
8. The power semiconductor module according to claim 1, further comprising a self-arc-extinguishing type semiconductor switching element which is electrically connected between the first external terminal and the second external terminal outside the housing and constitutes the first filter forming element.
9. The power semiconductor module according to claim 8, further comprising a resistor which is electrically connected in parallel to the semiconductor switching element outside the housing and constitutes the first filter forming element.
10. The power semiconductor module according to claim 8, further comprising a resistor which is electrically connected in series to the semiconductor switching element outside the housing and constitutes the first filter forming element.
11. The power semiconductor module according to claim 1, wherein
each of the first plurality of semiconductor elements is a self-arc-extinguishing type semiconductor switching element,
each of the respective terminals is a gate.
12. The power semiconductor module according to claim 1, wherein
each of the first plurality of semiconductor elements is a self-arc-extinguishing type semiconductor switching element,
each of the respective terminals is a collector.
13. The power semiconductor module according to claim 1, wherein
each of the first plurality of semiconductor elements is a self-arc-extinguishing type semiconductor switching element,
each of the respective terminals is an emitter.
14. The power semiconductor module according to claim 1, wherein
each of the first plurality of semiconductor elements is formed by a wide band gap semiconductor.
15. The power semiconductor module according to claim 14, wherein
the wide band gap semiconductor is any one of silicon carbide, gallium nitride, gallium oxide and diamond.

16. The power semiconductor module according to claim 1, further comprising a second plurality of semiconductor elements configured to operate in parallel, wherein
- the housing is configured to further house the second plurality of semiconductor elements,
- the first plurality of semiconductor elements constitute an upper arm,
- the second plurality of semiconductor elements constitute a lower arm,
- the power semiconductor module further comprises a third external terminal and a fourth external terminal connected to a second wiring which is connected by respective terminals of the second plurality of semiconductor elements, and configured to electrically connect a second filter forming element provided outside the housing to the second wiring,
- the third external terminal and the fourth external terminal are electrically connected to the second wiring in such a manner that a section electrically connecting the third external terminal and the fourth external terminal on the second wiring includes at least a part of a current-carrying region on the second wiring when the second plurality of semiconductor elements are operating in parallel.

* * * * *